(12) United States Patent
Yu et al.

(10) Patent No.: US 7,759,726 B2
(45) Date of Patent: Jul. 20, 2010

(54) NON-VOLATILE MEMORY DEVICE, NON-VOLATILE MEMORY CELL THEREOF AND METHOD OF FABRICATING THE SAME

(75) Inventors: Chao-Lun Yu, Hsinchu (TW); Chao-I Wu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 145 days.

(21) Appl. No.: 11/179,294

(22) Filed: Jul. 12, 2005

(65) Prior Publication Data
US 2007/0012993 A1    Jan. 18, 2007

(51) Int. Cl.
*H01L 29/792* (2006.01)
(52) U.S. Cl. ............... 257/321; 438/264; 438/E29.309
(58) Field of Classification Search ............... 257/260, 257/321, E29.309; 438/264
See application file for complete search history.

(56) References Cited
U.S. PATENT DOCUMENTS

| | | | | |
|---|---|---|---|---|
| 7,675,107 | B2* | 3/2010 | Nansei | 257/321 |
| 2004/0041214 | A1* | 3/2004 | Prall | 257/390 |
| 2004/0180496 | A1* | 9/2004 | Hsiao et al. | 438/257 |
| 2004/0212006 | A1* | 10/2004 | Harari et al. | 257/315 |
| 2004/0217428 | A1* | 11/2004 | Choi et al. | 257/374 |
| 2004/0262674 | A1* | 12/2004 | Shimizu | 257/324 |
| 2005/0009276 | A1* | 1/2005 | Rudeck | 438/264 |
| 2005/0164456 | A1* | 7/2005 | Deppe et al. | 438/275 |
| 2005/0164457 | A1* | 7/2005 | Kim et al. | 438/287 |
| 2005/0196923 | A1* | 9/2005 | Deppe et al. | 438/259 |
| 2006/0017092 | A1* | 1/2006 | Dong et al. | 257/314 |
| 2006/0192266 | A1* | 8/2006 | Willer et al. | 257/510 |
| 2007/0117323 | A1* | 5/2007 | Yeh | 438/261 |

OTHER PUBLICATIONS

Silicon Processing for the VLSI Era, vol. I: Process Technology, Wolf, Stanley, Tauber, Richard N., p. 409.*

* cited by examiner

*Primary Examiner*—N Drew Richards
*Assistant Examiner*—Jae Lee
(74) *Attorney, Agent, or Firm*—Thomas, Kayden, Horstemeyer & Risley (57) ABSTRACT

The present invention disclosed a non-volatile memory device and fabricating method thereof. The structure of non-volatile memory device at least comprises a substrate, several dielectric strips, several bit lines, a dielectrically stacking multi-layer, and several word lines. The substrate has several recesses. The dielectric strips are formed on the substrate, and each of the recess is interposed between two adjacent dielectric strips. The bit lines are respectively formed on the dielectric strips. The dielectrically stacking multi-layer comprising a charge-trapping layer is disposed on the bit lines and the recesses. The word lines are formed on the dielectrically stacking multi-layer and intersecting to the bit lines. When a voltage is applied to the bit lines, a plurality of inversion regions are respectively generated on the substrate.

36 Claims, 5 Drawing Sheets

NON-VOLATILE MEMORY DEVICE, NON-VOLATILE MEMORY CELL THEREOF AND METHOD OF FABRICATING THE SAME

BACKGROUND OF THE INVENTION

1. Field of the Invention

The invention relates in general to a non-volatile memory device, a non-volatile memory cell thereof and method of fabricating the same, and more particularly to a non-volatile memory device with an induced source/drain, a non-volatile memory cell thereof and method of fabricating the same.

2. Description of the Related Art

The memory devices for non-volatile storage of information, such as read only memory (ROM), programmable read only memory (PROM), erasable programmable read only memory (EPROM), and other advanced memory devices, are currently used in the worldwide industries. The other advanced memory devices that involve more complex processing and testing procedures include electrically erasable programmable read only memory (EEPROM), flash EEPROM, and nitride read-only memory (NROM). These advanced memory devices can accomplish the tasks that ROM can't do. For example, using EEPROM devices in circuitry permits in-circuit erasing and reprogramming of the device.

Figure 1A:
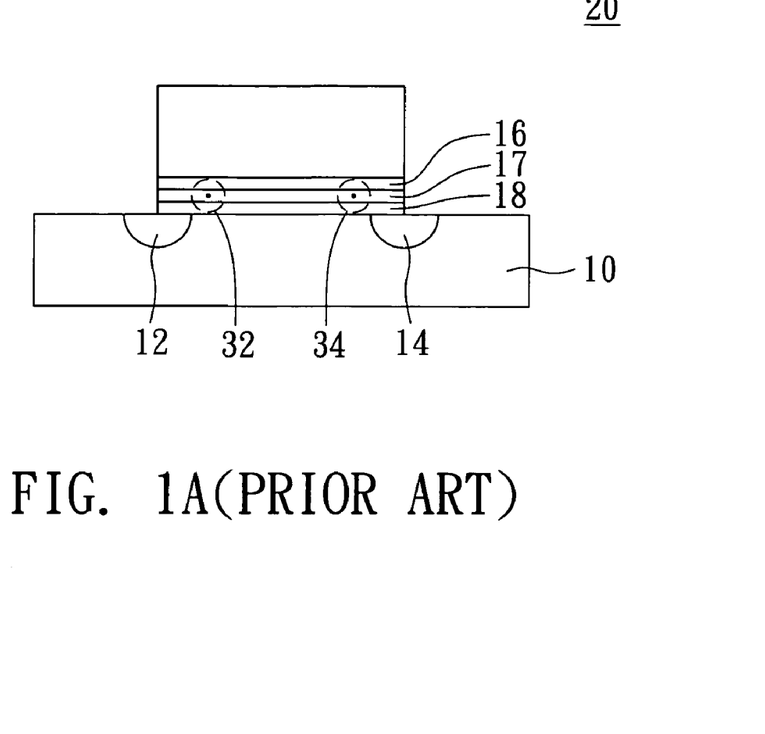
FIG. 1A (prior art) schematically shows a cross sectional view of a conventional non-volatile memory cell.

FIG. 1A schematically shows a cross sectional view of a conventional non-volatile memory cell. Take a NROM cell 20 for an example, the substrate 10 is implanted a source 12 and a drain 14. The top of substrate 10 lies an sandwiched structure having a nitride layer 17 between a top oxide layer 16 and a bottom oxide layer (tunneling oxide layer) 18, so known as ONO structure. The structure of NROM cell in which contains dual bit in one cell is also depicted in FIG. 1A. The two regions encircled with the dashed line denote the first bit 32 and the second bit 34. In the conventional process, the ONO layer is added over the substrate. The source/drain is then implanted, and the buried drain (BD) is formed. Following the implantation in the substrate, the polysilicon is deposited over the ONO layer of memory cell.

Figure 1B:
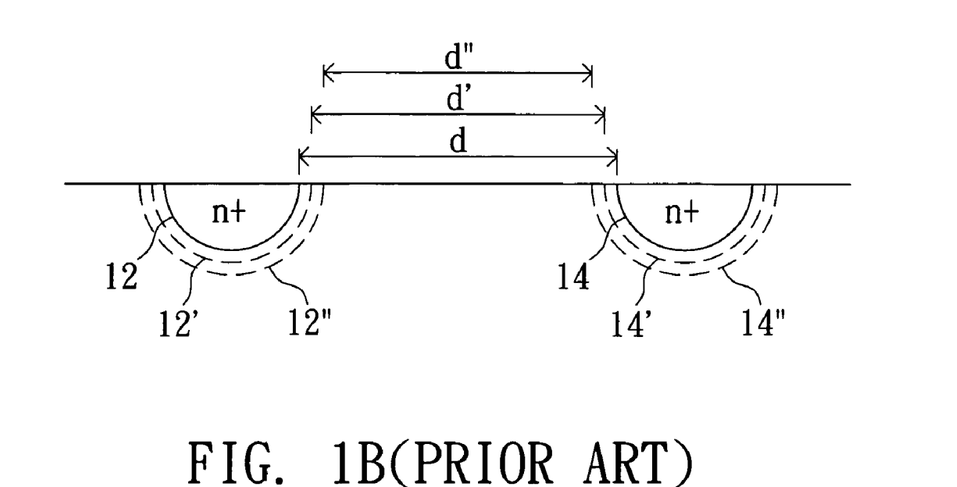
FIG. 1B (Prior Art) shows the BD diffusion of conventional non-volatile memory cell of FIG. 1A.

However, there are several drawbacks in the conventional structure and fabricating method. For example, the NROM cell with multiple oxide layers may have buried diffusion problem, as shown in FIG. 1B. In the conventional process, the phosphorus or arsenic ions are implanted and the source 12 and drain 14 are originally kept at a distance of d. After the second oxide layer grown on the first oxide layer, the source 12 and drain 14 diffuse and the distance between thereof is d', as the dash lines 12' and 14' depicts. Similarly, the source 12' and drain 14' diffuse (as depicted by dash lines 12" and 14") and the distance between thereof is d" if the third oxide layer is grown on the second oxide layer. According to the above description, it is clear that the BD over-diffusion problem may shorten the length of channel, and even result in the function failure caused by the two BD joined together, as so called 'punch-through'. From one aspect, the punch-through problem also hinders the cell size shrinkage of such type of memory since adequate channel length has to be maintained. Moreover, dual bits in a single cell are so close that the reading process of one bit will be interfered by another bit in the same cell, as so-called 'second-bit effect'.

SUMMARY OF THE INVENTION

It is therefore an object of the invention to provide a non-volatile memory device and fabricating method thereof, which can mitigate the punch-through problem and second-bit problem.

The invention achieves the above-identified object by providing a structure of non-volatile memory cell. The structure of non-volatile memory cell at least comprises a substrate, two dielectric strips, two conductors, a dielectrically stacking multi-layer, and a conductive layer. The substrate has a recess. The two dielectric strips are separately formed on the substrate, wherein the recess is interposed between two dielectric strips. The two conductors are respectively formed on the dielectric strips. The dielectrically stacking multi-layer comprising a charge-trapping layer is disposed on the conductors and the recess. The conductive layer is formed on the dielectrically stacking multi-layer. When a voltage is applied to the two conductors, two inversion regions are respectively generated on the substrate as source and drain.

Moreover, the invention achieves the above-identified object by providing structure of non-volatile memory device. The structure of non-volatile memory device at least comprises a substrate, several dielectric strips, several bit lines, a dielectrically stacking multi-layer, and several word lines. The substrate has several recesses. The dielectric strips are formed on the substrate, wherein each of the recess is interposed between two adjacent dielectric strips. The bit lines are respectively formed on the dielectric strips. The dielectrically stacking multi-layer comprising a charge-trapping layer is disposed on the bit lines and the recesses. The word lines are formed on the dielectrically stacking multi-layer and intersecting the bit lines. When a voltage is applied to the bit lines, a plurality of inversion regions are respectively generated on the substrate.

Further, the invention achieves the above-identified object by providing a method of fabricating a non-volatile memory cell. The method of fabricating a non-volatile memory cell at least comprising steps of: providing a substrate; forming two dielectric strips on the substrate and two conductors thereon; forming a recess in the substrate between the two conductors; forming a dielectrically stacking multi-layer for covering the conductors and the recess; and forming a conductive layer on the dielectrically stacking multi-layer. When a voltage is applied to the two conductors, two inversion regions are respectively generated on the substrate as source and drain.

Furthermore, the invention achieves the above-identified object by providing a method of fabricating a non-volatile memory device. The method of fabricating a non-volatile memory device at least comprising steps of: providing a substrate; forming a plurality of dielectric strips on the substrate and a plurality of bit lines thereon; forming a plurality of recesses in the substrate between the bit lines; forming a dielectrically stacking multi-layer for covering the bit lines and recesses; and forming a plurality of word lines parallel on the dielectrically stacking multi-layer, wherein the word lines are intersected the bit lines. When a voltage is applied to the bit lines, a plurality of inversion regions are respectively generated on the substrate as source and drain.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2A:
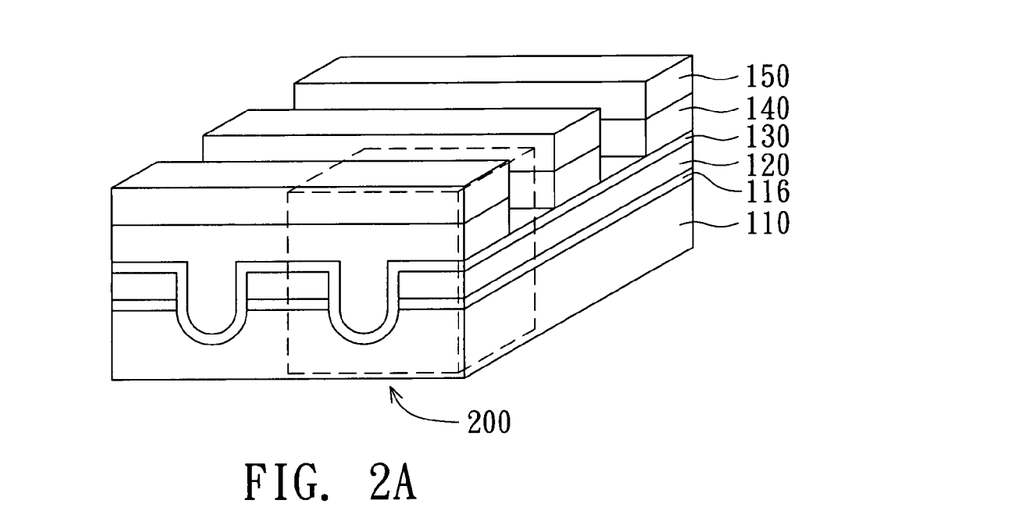
FIG. 2A schematically illustrates a perspective view of a non-volatile memory device having several Non-volatile memory cell according to the preferred embodiment of the invention.

Referring to FIG. 2A, it is a perspective view illustrating a non-volatile memory device having several Non-volatile memory cell according to the preferred embodiment of the invention. The non-volatile memory device 100 at least includes a substrate 110, several dielectric strips 116, several bit lines 120, a dielectrically stacking multi-layer 130, and several word lines 140. The substrate 110, such as a P-type substrate, has several recesses 112. The dielectric strips 116 are formed on the substrate 110, and each of the recess 112 is interposed between two adjacent dielectric strips 116. The bit lines 120 are formed on the dielectric strips 116. The dielectrically stacking multi-layer 130 comprising a charge-trapping layer is disposed on the bit lines 120 and the recesses 112. The word lines are formed on the dielectrically stacking multi-layer 130 and intersected the bit lines 120.

Figure 2B:
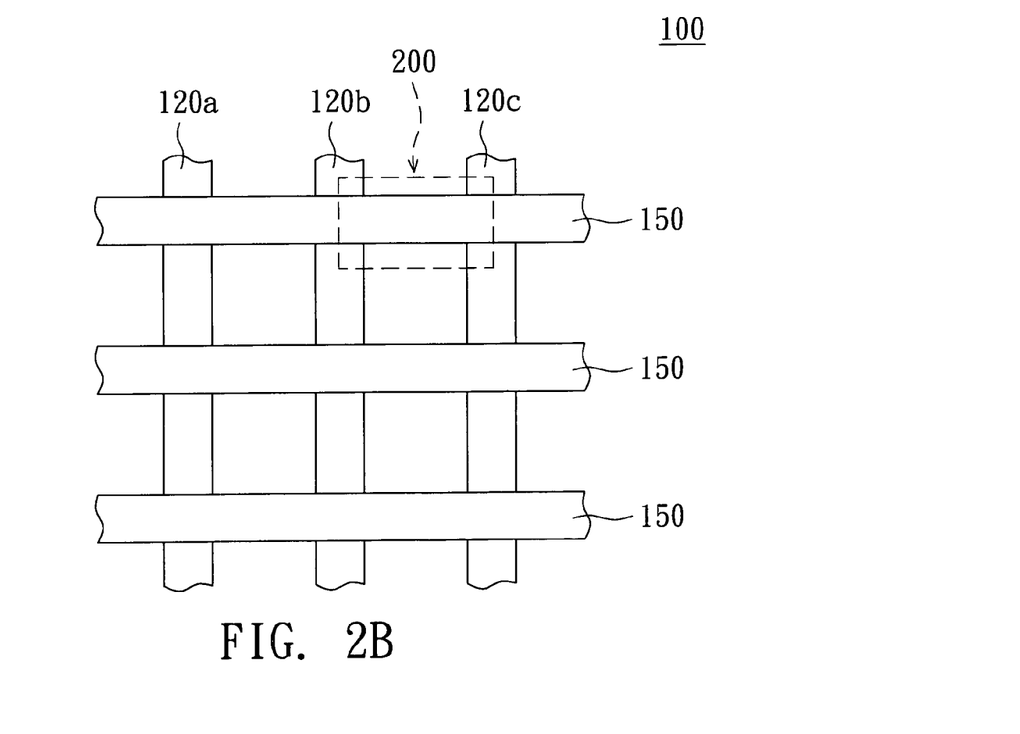
FIG. 2B schematically illustrates a top view of the non-volatile memory device of FIG. 2A.

Referring to FIG. 2B, it is a top view illustrating the non-volatile memory device of FIG. 2A. The word lines 140 are intersected the bit lines 120 at right angle, and the non-volatile memory device 100 comprises many non-volatile memory cells 200 arranged as an array. The structure of the non-volatile memory cell 200 is inherently similar to the structure of non-volatile memory device 100. As shown in FIG. 2A, the non-volatile memory cell 200 at least comprises a substrate 110, two dielectric strips 116a and 116b, two conductors 120a and 120b, an dielectrically stacking multi-layer 130, and a conductive layer 140a. The conductors 120a and 120b in the memory cell 200 are the same as the bit lines 120 in the memory device 100. The conductive layer 140a in the memory cell 200 are the same as the word lines 140 in the memory device 100. The conductive layer is served as the gate in the memory cell 200.

Preferably, the substrate 110 is a P-type substrate, which is doped by Boron or $BF_2^+$. The bit lines 120, also including the conductors 120a and 120b, are made of conductive material, such as polysilicon, Titanium silicide (TiSi2), Cobalt silicide (CoSi2), and Nickel silicide(NiSi). Preferably, the bit lines 120 are polysilicon layers whose thickness is less than 2000 angstroms (Å), but the thickness is immaterial. The word lines 140 (i.e conductive layer 140a) preferably comprise polysilicon, and a metal silicide layer 150, such as Tungsten Silicide ($WSi_x$), is preferably covered on the word lines 140 (i.e conductive layer 140a).

Figure 3:
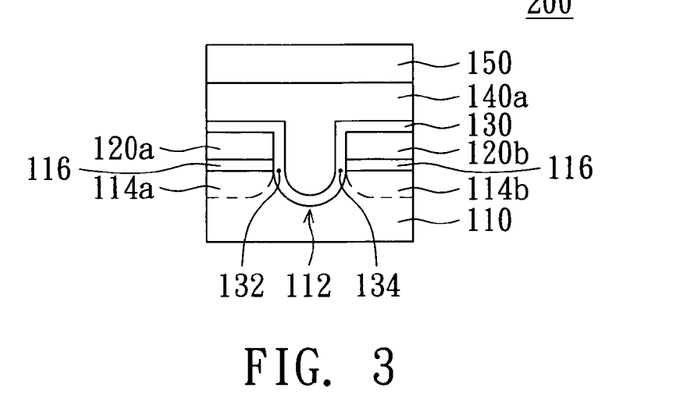
FIG. 3 schematically illustrates a cross-sectional view of the electrically programmable non-volatile memory cell of FIG. 2A in operation.

Referring to FIG. 3, it is a cross-sectional view illustrating the electrically programmable non-volatile memory cell of FIG. 2A in operation. When a voltage Vi is applied to the conductors 120a and 120b, two inversion regions 114a and 114b induced by the adjacent conductors 120a and 120b are generated on the substrate 110 as source/drain regions for the non-volatile memory cell 200 and the non-volatile memory device 100. For example, the substrate 110 is a P-type substrate, which is doped by Boron or $BF_2^+$, and the positive voltage Vi is applied to the conductors 120a and 120b. The electrons attracted by the positive conductors 120a and 120b biased at positive voltage Vi are aggregated, so that part of the P-type substrate 110, adjacent to the two conductors 120a and 120b, is inversed to $n^+$ regions 114a and 114b, which acts as source/drain regions for the memory cell 200. It is noted that the ion-implanted buried bit lines (BL) and the ion-implanted buried drain (BD) are not necessary for the non-volatile memory device of the invention. By the inversion of the substrate, the induced source/drain having no dopant can mitigate the BD over-diffusion problem and punch through problem. Furthermore, the size of the non-volatile memory cell of the invention can be further minimized for the next generation product.

The dielectrically stacking multi-layer 130 has at least one charge-trapping layer at which the electron is capable of trapping. Preferably, the dielectrically stacking multi-layer 130 is an ONO stacking layer. The ONO stacking layer includes a top oxide layer, a nitride layer, and a bottom oxide layer. The top and the bottom oxide layer are thicker than 20 Å to avoid any direct tunneling. The intermediate layer, i.e, the nitride layer, is the retaining material for two distinguishable pockets of electrons 132 and 134. The two distinguishable pockets of electrons 132 and 134 are selectively accumulated in the areas of the nitride layer which are adjacent to the induced source/drain 114a and 114b respectively, as shown in FIG. 3. In other words, the dielectrically stacking multi-layer 130 has two charge storage regions which is separated from each other by the non-linear dielectrically stacking multi-layer 130, preferably U-shaped ONO stacking layer, formed on the surface of the recess 112. That is, the dual bits are separated by the U-shaped ONO stacking layer, and the effective distance between the dual bits along the surface of the U-shaped ONO stacking layer in the invention is longer than the distance between the dual bits along the linear ONO stacking layer in conventional NROM cell. It prevents the dual bits from second-bit effect, even if the size of the non-volatile memory cell is further minimized.

The Programming operation of the non-volatile memory cell 200 is performed by Channel Hot Electron (CHE) injection, where approximately one thousand electrons are trapped in a lumped packet close to the drain side of the cell 200. These electrons are situated in localized states in the nitride layer. In order to program the opposite side of the cell 200, one simply reverses the role of drain and source during programming.

By raising the bit line voltage high enough while leaving the word line at zero or negative voltage, Enhanced Tunneling Hot-Holes Injection near the inversion bit line junction occurs, causing holes to enter the nitride layer and recombine with trapped electrons.

Figure 4A:
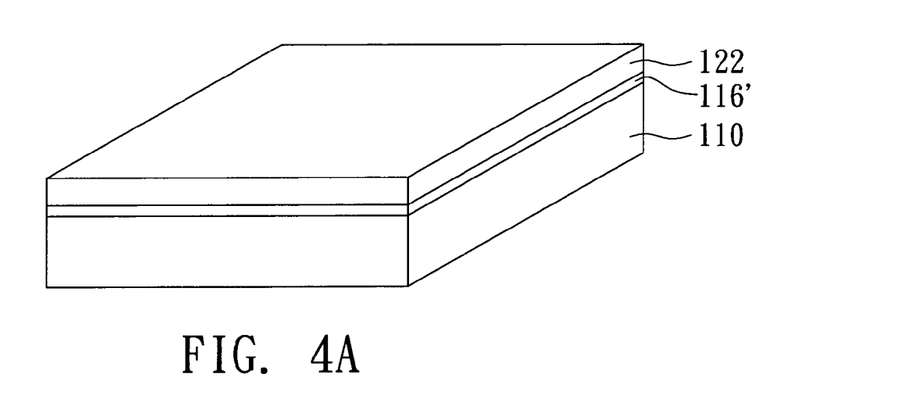
FIG. 4A~FIG. 4F illustrate the method of fabricating the non-volatile memory device according to the preferred embodiment of the invention.
Figure 4B:
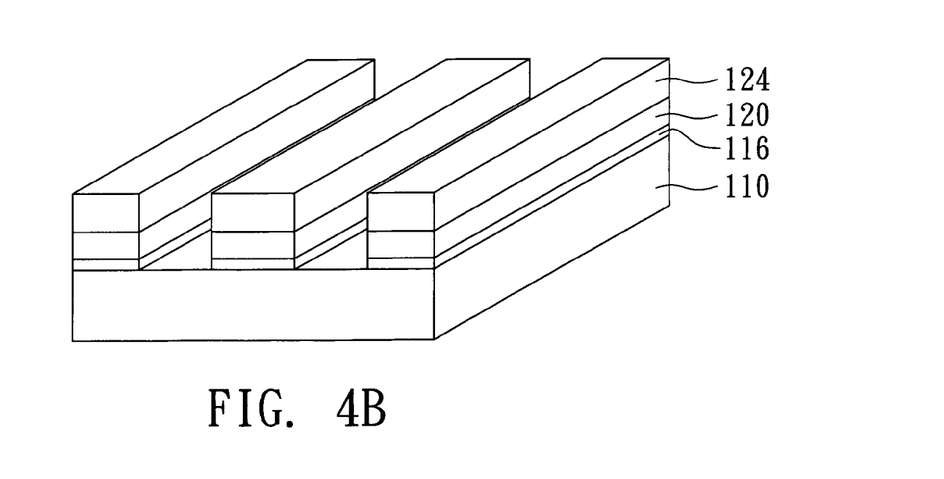

FIG. 4A ~FIG. 4F illustrate the method of fabricating the non-volatile memory device according to the preferred embodiment of the invention. First, a substrate 110 is provided as shown in FIG. 4A. The substrate 110 is preferably a p-type substrate, which is doped by Boron or $BF_2^+$. Then, a dielectric layer 116' is depositing on the substrate 110, and a conductive layer 122 is depositing on the substrate 110 as shown in FIG. 4A. A patterned photoresist 124, which is patterned according to the mask, is formed on the conductive layer 122. The conductive layer 122 is made of conductive material, such as polysilicon, Titanium silicide (TiSi2), Cobalt silicide(CoSi2), and Nickel silicide(NiSi). Afterward, the conductive layer 122 is etched according to the patterned photoresist 124 to forming several dielectric strips 116 and bit lines 120. Thus, several dielectric strips 116 are formed parallel on the substrate 110, and several bit lines 120 are formed on the dielectric strips 116 shown in FIG. 4B. Preferably, the bit lines 120 are polysilicon layers whose thickness is less than 2000 angstroms (Å), but the thickness is immaterial.

Figure 4C:
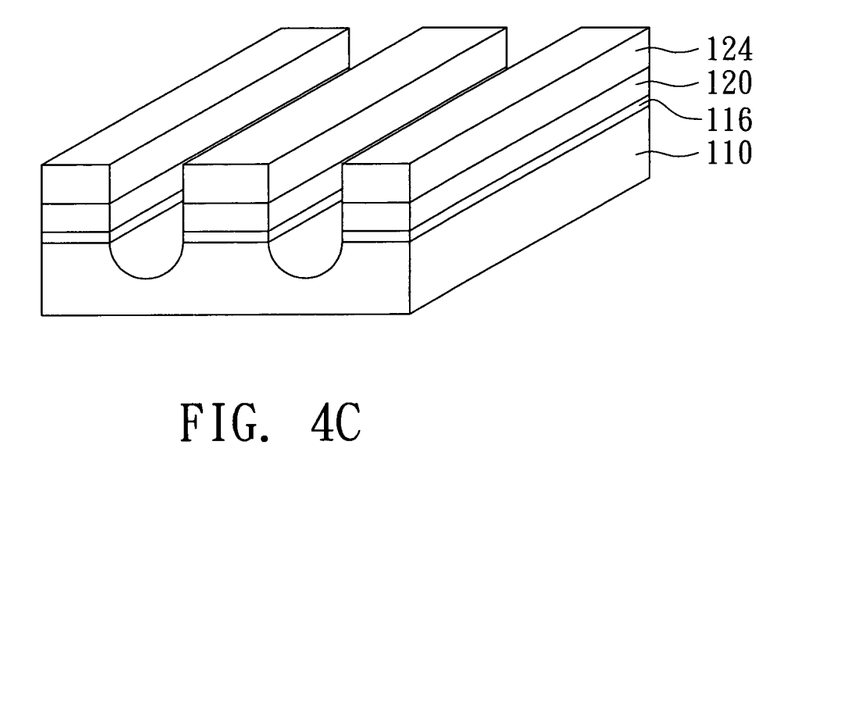

Next, the substrate 110 is further etched according to the patterned photoresist 124 and the bit lines 120 to form several recesses 112, and the patterned photoresist 124 is removed. Thus, several recesses 112 are formed in the substrate 110 between the bit lines 120. The recess is preferably a U-shaped recess.

Figure 4D:
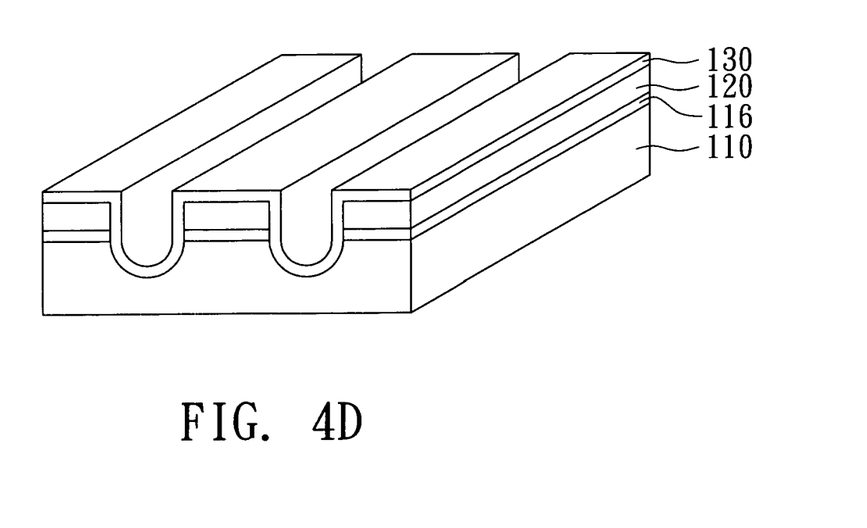

Afterward, a dielectrically stacking multi-layer 130 is formed and covers the bit lines 120 and the recesses 112. The dielectrically stacking multi-layer 130 is preferably an ONO stacking layer. The ONO stacking layer includes a bottom oxide layer (tunneling oxide layer) grown on the bit lines 120 and the recesses 112, a nitride layer deposited over the bottom oxide layer, and a top oxide layer produced on the nitride layer.

Figure 4E:
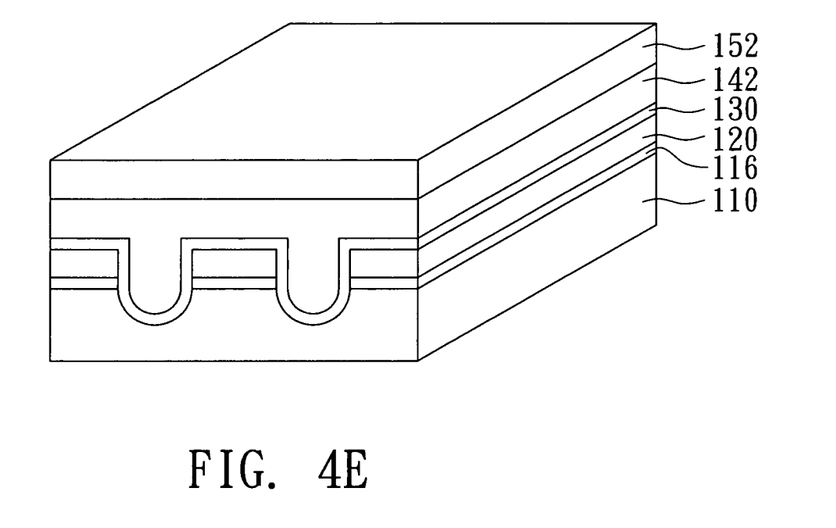
Figure 4F:
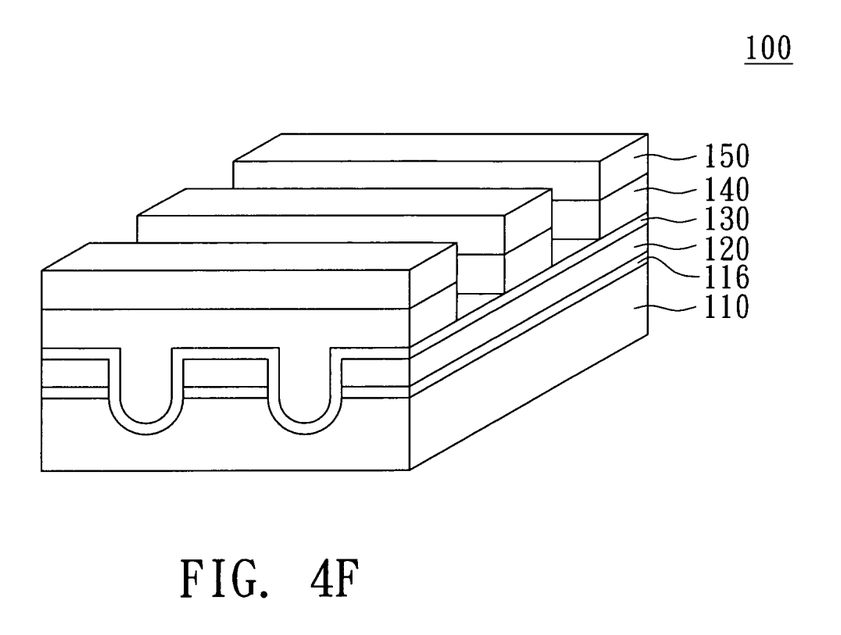

Next, the word lines 140 are parallel formed on the dielectrically stacking multi-layer, and intersected to the bit lines 120 as shown in FIG. 4F. The detailed steps are stated below. First, a conductive layer, such as a polysilicon layer, 142 is formed on the dielectrically stacking multi-layer 130, and a metal silicide layer 152 is formed thereon as shown in FIG. 4E. After a patterned photoresist is formed on over the conductive layer 142, the conductive layer 142 and the metal silicide layer 152 are etched according to the patterned photoresist until exposing the dielectrically stacking multi-layer 130. Thus, several word lines 140 are formed on the dielectrically layer 130, and intersect the bit lines 120. The patterned metal silicide layer 150, such as Silicide (Wsi$_x$), covers word lines 140. Besides, the conductive layer 142 is preferably etched by plasma descum process, because the object descumming by the plasma can be selectively aimed at the specific material, such as polysilicon. Even other material, such as the dielectrically stacking multi-layer 130, is exposed in the same reaction condition, and the dielectrically stacking multi-layer 130 is prevented from etching. Thus, the dielectrically stacking multi-layer 130 are severed as an etching-stop point in this step.

The non-volatile memory device and fabricating method thereof disclosed in the preferred embodiments stated above have many advantages. The dual bits are separated by the non-linear dielectrically stacking multi-layer, and the effective distance between the dual bits along the surface of the non-linear dielectrically stacking multi-layer in the invention is longer than the distance between the dual bits along the linear ONO stacking layer in conventional NROM cell. It prevents the dual bits from second-bit effect, even if the size of the non-volatile memory cell is further minimized. In addition, ion-implanted buried bit lines (BL) and the ion-implanted buried drain (BD) are not necessary for the non-volatile memory device of the invention, and the source/drain which is inversed by the conductors with positive charge can mitigate the BD over-diffusion problem and punch through problem. Furthermore, the size of the non-volatile memory cell of the invention can be further minimized for the next generation product.

While the invention has been described by way of examples and in terms of the preferred embodiments, it is to be understood that the invention is not limited thereto. It is intended to cover various modifications and similar arrangements and procedures, and the scope of the appended claims therefore should be accorded the broadest interpretation so as to encompass all such modifications and similar arrangements and procedures.

What is claimed is:

1. A structure of non-volatile memory cell, comprising:
   a substrate having a recess;
   two dielectric strips separately formed on the substrate, wherein the recess is interposed between two dielectric strips;
   two conductors respectively formed over the dielectric strips;
   a dielectrically stacking multi-layer comprising a charge-trapping layer, the dielectrically stacking multi-layer being formed on the conductors and along the recess, the dielectrically stacking multi-layer in contact with two upper surfaces and two lateral surfaces of the two conductors, two lateral surfaces of the two dielectric strips, and an inner surface of the recess;
   a conductive layer, formed on the dielectrically stacking multi-layer; and
   wherein when a voltage is applied to the two conductors, two inversion regions are respectively generated in the substrate so as to act as an induced source and an induced drain, the induced source and the induced drain respectively located beneath the two dielectric strips and the two conductors, a part of the dielectrically stacking multi-layer covering the inner surface of the recess being positioned between the induced source and drain.

2. The structure of non-volatile memory cell according to claim 1, wherein the conductors comprises polysilicon.

3. The structure of non-volatile memory cell according to claim 1, wherein the thickness of the conductors is less then 2000 Å.

4. The structure of non-volatile memory cell according to claim 1, wherein the dielectrically stacking multi-layer has two charge storage regions, separated from each other by the non-linear dielectrically stacking multi-layer formed along the recess.

5. The structure of non-volatile memory cell according to claim 1, wherein the dielectrically stacking multi-layer is an ONO layer, including a top oxide layer, a silicon nitride layer, and a bottom oxide layer.

6. A structure of non-volatile memory device, at least comprising,
   a substrate having a plurality of recesses; and
   a plurality of dielectric strips formed on the substrate, wherein each of the recess is interposed between two adjacent dielectric strips;
   a plurality of bit lines respectively formed over the dielectric strips;
   a dielectrically stacking multi-layer comprising a charge-trapping layer, the dielectrically stacking multi-layer being formed on the bit lines and along the recesses, the dielectrically stacking multi-layer in contact with an upper surface and an lateral surface of each bit lines, an lateral surface of each dielectric strips, and an inner surface of each recesses;
   a plurality of word lines formed on the dielectrically stacking multi-layer and intersecting the bit lines; and
   wherein when a voltage is applied to the bit lines, a plurality of inversion regions are respectively generated in the substrate so as to act as plural pairs of induced source and induced drain, every pair of the induced source and the induced drain respectively located beneath the two adjacent dielectric strips and the two adjacent bit lines, a part of the dielectrically stacking multi-layer covering the inner surface of the recess being positioned between the induced source and drain.

7. The structure of non-volatile memory device according to claim 6, wherein the dielectrically stacking multi-layer is an ONO layer, including a top oxide layer, a silicon nitride layer, and a bottom oxide layer.

8. The structure of non-volatile memory device according to claim 6, wherein the bit lines comprise polysilicon.

9. The structure of non-volatile memory device according to claim 6, wherein the thickness of the bit lines is less than 2000 Å.

10. The structure of non-volatile memory device according to claim 6, wherein the dielectrically stacking multi-layer has two charge storage regions, separated from each other by the non-linear dielectrically stacking multi-layer formed along the recess.

11. A method of fabricating a non-volatile memory cell, at least comprising steps of:
   providing a substrate;
   forming two dielectric strips on the substrate and two conductors over the two dielectric strips;
   forming a recess in the substrate between the two conductors;
   forming a dielectrically stacking multi-layer for covering the conductors and the recess, comprising:
      forming the dielectrically stacking multi-layer on the conductors and along the recess, the dielectrically stacking multi-layer in contact with two upper surfaces and two lateral surfaces of the two conductors, two lateral surfaces of the two dielectric strips, and an inner surface of the recess, the dielectrically stacking multi-layer comprising a charge-trapping layer;
   forming a conductive layer on the dielectrically stacking multi-layer; and
   wherein when a voltage is applied to the two conductors, two inversion regions are respectively generated in the substrate so as to act as an induced source and an induced drain, the induced source and the induced drain respectively located beneath the two dielectric strips and the two conductors, a part of the dielectrically stacking multi-layer covering the inner surface of the recess being positioned between the induced source and drain.

12. The method of fabricating a non-volatile memory cell according to the claim 11, wherein the step of forming the dielectric strips on the substrate and the conductors thereon comprises steps of:
   depositing a dielectric layer on the substrate;
   depositing a conductive layer on the dielectric layer;
   forming a patterned photoresist on the conductive layer;
   etching the conductive layer and the dielectric layer according to the patterned photoresist, and forming two conductors and two dielectric strips; and
   removing the patterned photoresist.

13. The method of fabricating a non-volatile memory cell according to claim 11, wherein after the conductive layer is formed, a metal silicide layer is formed thereon.

14. The method of fabricating a non-volatile memory cell according to claim 11, wherein the conductors comprise polysilicon.

15. The method of fabricating a non-volatile memory cell according to claim 11, wherein the dielectrically stacking multi-layer is an ONO layer, the step of forming a dielectrically stacking multi-layer for covering the two conductors and the recess comprises:
   forming a bottom oxide layer on the two conductors and along the recess, wherein the bottom oxide layer in contact with an upper surface and a lateral surface of each two conductors, a lateral surface of each dielectric strips, and an inner surface of recess;
   forming a silicon nitride layer for entirely covering the bottom oxide layer; and
   forming a top oxide layer for entirely covering the silicon nitride layer.

16. A method of fabricating a non-volatile memory device, at least comprising steps of:
   providing a substrate;
   forming a plurality of dielectric strips parallel on the substrate and a plurality of bit lines over the plurality of dielectric strips;
   forming a plurality of recesses in the substrate between the bit lines;
   forming a dielectrically stacking multi-layer for covering the bit lines and recesses, comprising:
      forming the dielectrically stacking multi-layer on the conductors and along the recess, the dielectrically stacking multi-layer in contact with an upper surface and a lateral surface of each bit lines, a lateral surface of each dielectric strips, and an inner surface of each recesses, the dielectrically stacking multi-layer comprising a charge-trapping layer; and
   forming a plurality of word lines parallel on the dielectrically stacking multi-layer, wherein the word lines are intersected to the bit lines; and
   wherein when a voltage is applied to the bit lines, a plurality of inversion regions are respectively generated in the substrate so as to act as plural pairs of an induced source and an induced drain, every pair of the induced source and the induced drain respectively located beneath the two adjacent dielectric strips and the two adjacent bit lines, a part of the dielectrically stacking multi-layer covering the inner surface of the recess being positioned between the induced source and drain.

17. The method of fabricating a non-volatile memory device according to claim 16, wherein the step of forming the dielectric strips parallel on the substrate and the bit lines thereon comprises steps of:
   depositing a dielectric layer on the substrate;
   depositing a conductive layer on the dielectric layer;
   forming a patterned photoresist on the conductive layer;
   etching the conductive layer and the dielectric layer according to the patterned photoresist, and forming a plurality of bit lines and dielectric strips; and
   removing the patterned photoresist.

18. The method of fabricating a non-volatile memory device according to claim 16, wherein the step of forming the word lines comprises:
   forming a conductive layer on the dielectrically stacking multi-layer;
   forming a patterned photoresist on the conductive layer;
   etching the conductive layer according to the patterned photoresist, and exposing part of the dielectrically stacking multi-layer; and
   removing the patterned photoresist.

19. The method of fabricating a non-volatile memory device according to claim 16, wherein after the conductive layer is formed, a metal silicide layer is formed thereon.

20. The method of fabricating a non-volatile memory device according to claim 19, wherein the word lines are formed through descumming the conductive layer according to the patterned photoresist.

21. The method of fabricating a non-volatile memory device according to claim 16, wherein the bit lines comprise polysilicon.

22. The method of fabricating a non-volatile memory device according to claim 16, wherein the dielectrically stacking multi-layer is an ONO layer, the step of forming a dielectrically stacking multi-layer for covering the bit lines and recesses comprises:
   forming a bottom oxide layer on the bit lines and along the recesses, wherein the bottom oxide layer in contact with an upper surface and a lateral surface of each bit lines, a lateral surface of each dielectric strips, and an inner surface of each recesses;
   forming a silicon nitride layer for entirely covering the bottom oxide layer; and
   forming a top oxide layer for entirely covering the silicon nitride layer.

23. The structure of non-volatile memory cell according to claim 1, wherein the substrate has a dopant of a first conductive type, and the induced source and the induced drain shows a second conductive type contrary to the first conductive type.

24. The structure of non-volatile memory cell according to claim 5, wherein the silicon nitride layer entirely covers the bottom oxide layer and extended along the recess.

25. The structure of non-volatile memory cell according to claim 6, wherein the substrate has a dopant of a first conductive type, and every pair of the induced source and the induced drain shows a second conductive type contrary to the first conductive type.

26. The structure of non-volatile memory cell according to claim 7, wherein the silicon nitride layer entirely covers the bottom oxide layer and extended along each of the recesses.

27. The method of fabricating non-volatile memory cell according to claim 11, wherein the substrate has a dopant of a first conductive type, and the induced source and the induced drain shows a second conductive type contrary to the first conductive type.

28. The method of fabricating non-volatile memory cell according to claim 16, wherein the substrate has a dopant of a first conductive type, and every pair of the induced source and the induced drain shows a second conductive type contrary to the first conductive type.

29. The structure of non-volatile memory cell according to claim 1, wherein the conductive layer being served as a gate.

30. The structure of non-volatile memory cell according to claim 1, wherein the substrate is formed by a single material.

31. The structure of non-volatile memory device according to claim 6, wherein the word lines being served as a plurality of gates.

32. The structure of non-volatile memory device according to claim 6, wherein the substrate is formed by a single material.

33. The method of fabricating a non-volatile memory cell according to claim 11, wherein the conductive layer being served as a gate.

34. The method of fabricating a non-volatile memory cell according to claim 11, wherein the substrate is formed by a single material.

35. The method of fabricating a non-volatile memory device according to claim 16, wherein the word lines being served as a plurality of gates.

36. The method of fabricating a non-volatile memory device according to claim 16, wherein the substrate is formed by a single material.

* * * * *